United States Patent
Cheer

(10) Patent No.: US 6,940,347 B2
(45) Date of Patent: Sep. 6, 2005

(54) AMPLIFIER

(75) Inventor: Eric R Cheer, Christchurch (GB)

(73) Assignee: BAE Systems (Defence Systems) Limited, Farnborough (GB)

( * ) Notice: Subject to any disclaimer, the term of this patent is extended or adjusted under 35 U.S.C. 154(b) by 14 days.

(21) Appl. No.: 10/474,719

(22) PCT Filed: Apr. 25, 2002

(86) PCT No.: PCT/GB02/01927

§ 371 (c)(1),
(2), (4) Date: Oct. 10, 2003

(87) PCT Pub. No.: WO02/091567

PCT Pub. Date: Nov. 14, 2002

(65) Prior Publication Data

US 2004/0104769 A1 Jun. 3, 2004

(30) Foreign Application Priority Data

May 3, 2001 (GB) .............................................. 0110854

(51) Int. Cl.⁷ ................................................ H03F 3/60
(52) U.S. Cl. ........................................ 330/53; 330/302

(58) Field of Search ............................. 330/53, 302, 306

(56) References Cited

U.S. PATENT DOCUMENTS

| | | | |
|---|---|---|---|
| 4,072,949 A | | 2/1978 | Van Brunt |
| 4,176,351 A | * | 11/1979 | DeVita et al. ............... 342/111 |
| 4,315,228 A | * | 2/1982 | Moore ........................ 333/193 |
| 4,358,763 A | | 11/1982 | Strauch |
| 4,679,047 A | | 7/1987 | Tomasi |
| 4,754,227 A | | 6/1988 | Teague |
| 5,376,786 A | * | 12/1994 | MacDonald ........... 250/227.12 |
| 5,530,402 A | | 6/1996 | Wright |
| 5,956,098 A | * | 9/1999 | Mizukami et al. .......... 348/735 |

FOREIGN PATENT DOCUMENTS

| | | |
|---|---|---|
| EP | 0 282 195 A2 | 9/1988 |
| EP | 0 795 956 A1 | 9/1997 |

* cited by examiner

Primary Examiner—Patricia Nguyen
(74) Attorney, Agent, or Firm—Nixon & Vanderhye P.C.

(57) ABSTRACT

A re-circulating amplifier comprising a SAW filter with group delay characteristics for providing a time delay function.

12 Claims, 2 Drawing Sheets

US 6,940,347 B2

AMPLIFIER

Figure 1:
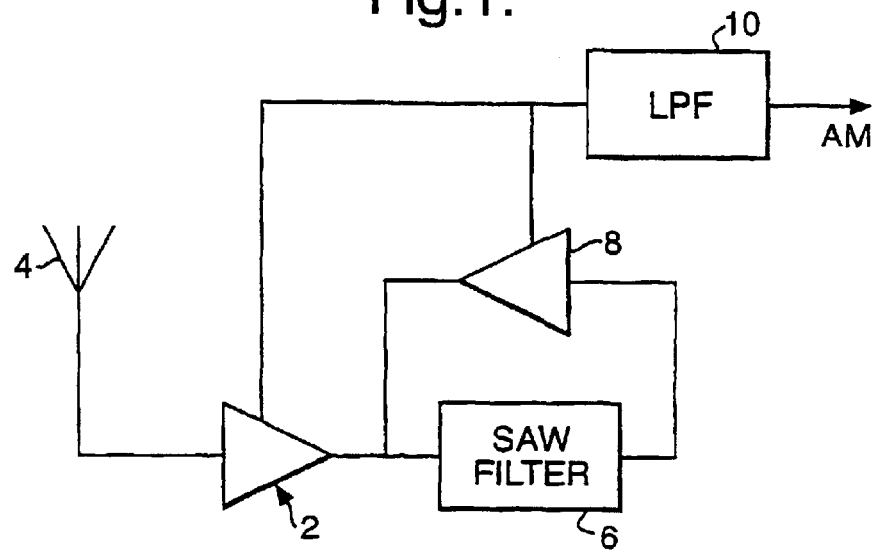

This application is the US national phase of international application PCT/GB02/01927, filed 25 Apr. 2002, which designated the US. PCT/GB02/01927 claims priority to GB Application No. 0110854.7, filed 3 May 2001. The entire contents of these applications are incorporated herein by reference.

This invention relates to the field of amplifiers and more particularly, but not exclusively to such amplifiers used in radio frequency receivers and transceivers.

There is an ever increasing requirement in the field of commercial radio based products for reductions in the size and energy requirements of radio frequency (RF) receivers and transceivers. Such receivers and transceivers are required to exhibit very high reliability for use in systems where products may be required to be deployed for a long periods of time powered by only a small power source.

Additionally such receivers and transceivers are typically required to exhibit good sensitivity, selectivity and freedom from spurious responses. Exceptionally such devices must minimise or eliminate any electrical emissions (such as provided by a local oscillator or the instability in an amplifier).

Low current small size receivers capable of partially meeting the requirements above include designs based on a 'crystal' detector, TRF, super-regen and sequential amplifiers.

Each of these components has inherent problems, including the inadequate sensitivity of the 'crystal' the TRF (Tuned Radio Frequency) being limited in its sensitivity by the RF gain and the isolation between the antenna and detector. Additionally the selectivity of TRF is not particularly good.

Furthermore the super-regen is inherently unstable and is liable to emit radiation on the receive frequency.

A receiver based on the sequential amplifier goes furthest toward meeting any new exacting requirements. This device uses a surface acoustic wave (SAW) band-pass RF filter for frequency determination with two (or more) amplifiers linked through a SAW delay line. Each amplifier stage is energised alternately so that inadvertent coupling between the amplifiers does not produce instability.

However, this topology is limited by several factors:
a) The state of the art configurations use two SAW devices, a filter to define the operational frequency and a delay line to provide the necessary time delay.
b) Ideal SAW delay lines suffer an intrinsic 6 dB insertion loss, real delay lines suffer additional losses caused by many factors including the efficiency of transducers and propagation along the device. Loss in the delay line must be compensated by higher gain in the amplifiers that consume greater supply current.
c) Conventional SAW delay lines must be sufficiently long to accommodate the transmission path that provides the requisite delay. Methods of folding the transmission path are available (to make the device smaller) at the expense of insertion loss. Thus devices with appreciable delay are physically large and may be the limiting factor in defining the dimensions of the receiver.
d) The amplifiers are energised with a high duty cycle (i.e. 50%)

Accordingly there is provided a re-circulating amplifier comprising a SAW filter with group delay characteristics said characteristics providing a time delay function.

In a preferred embodiment of the invention a re-circulating amplifier is provided wherein the SAW filter comprises a combination of characteristics including group delay and frequency selectivity simultaneously as part of a sequential amplifier.

In a further embodiment of the invention a receiver is provided, comprising a re-circulating amplifier, wherein said re-circulating amplifier does not comprise a local oscillator or super-regeneration means.

In a yet further embodiment of the invention a transceiver is provided comprising a re-circulating amplifier, wherein said re-circulating amplifier does not comprise a local oscillator or super-regeneration means.

The invention will now be described by way of example only with reference to the accompanying drawings in which;

FIG. 1—shows a block diagram of an receiver in accordance with the invention

Figure 2:
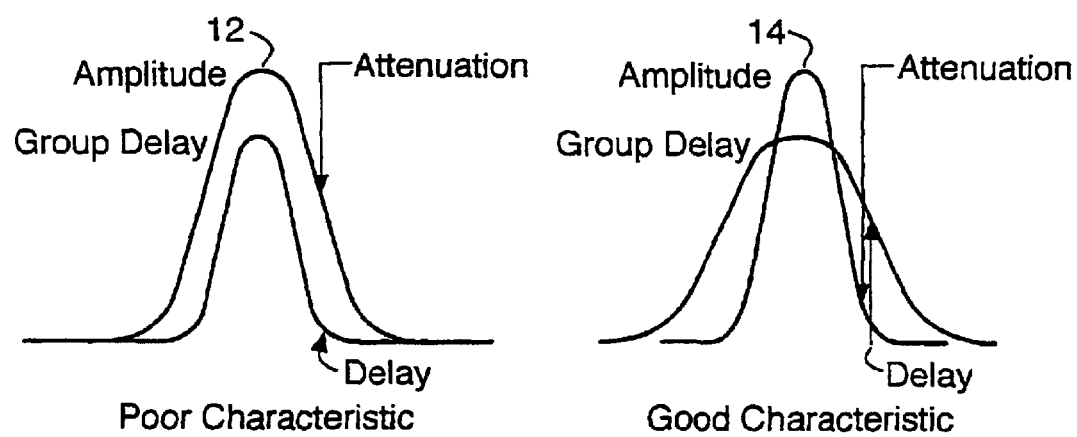
Figure 3:
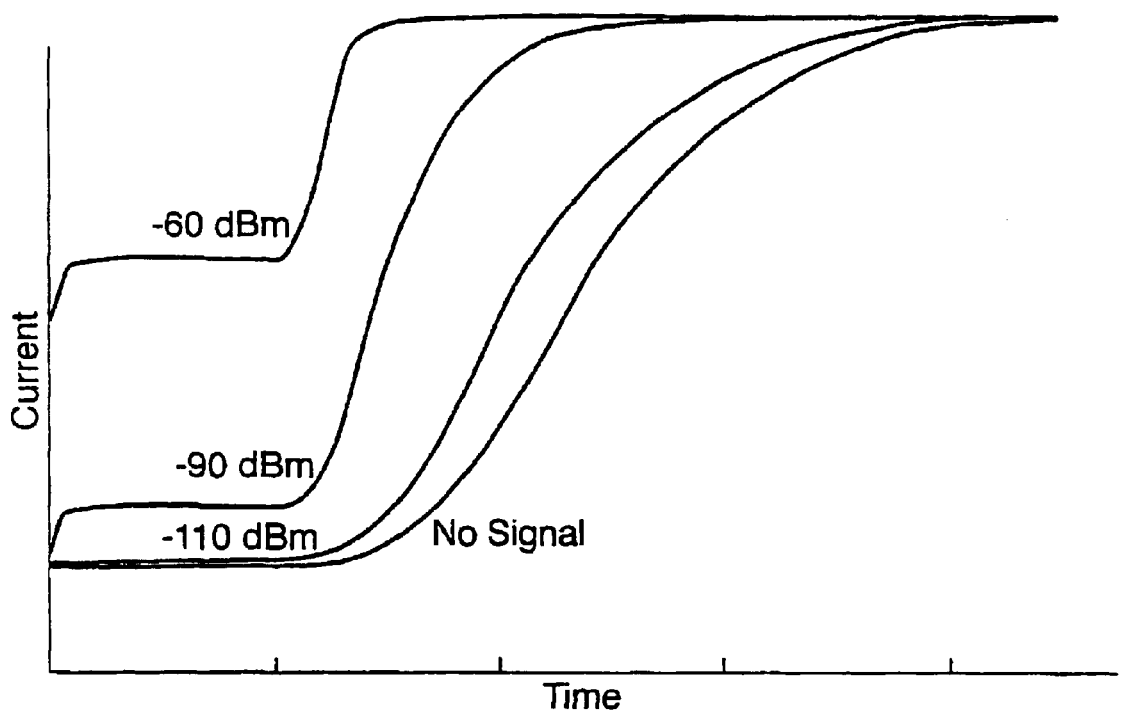

FIG. 2—shows two diagrammatic representations of the attenuation and delay characteristics of an amplifier and filter FIG. 3—shows a graph of the supply current consumed by a receiver plotted against time for a range of input signal amplitudes.

Figure 4:
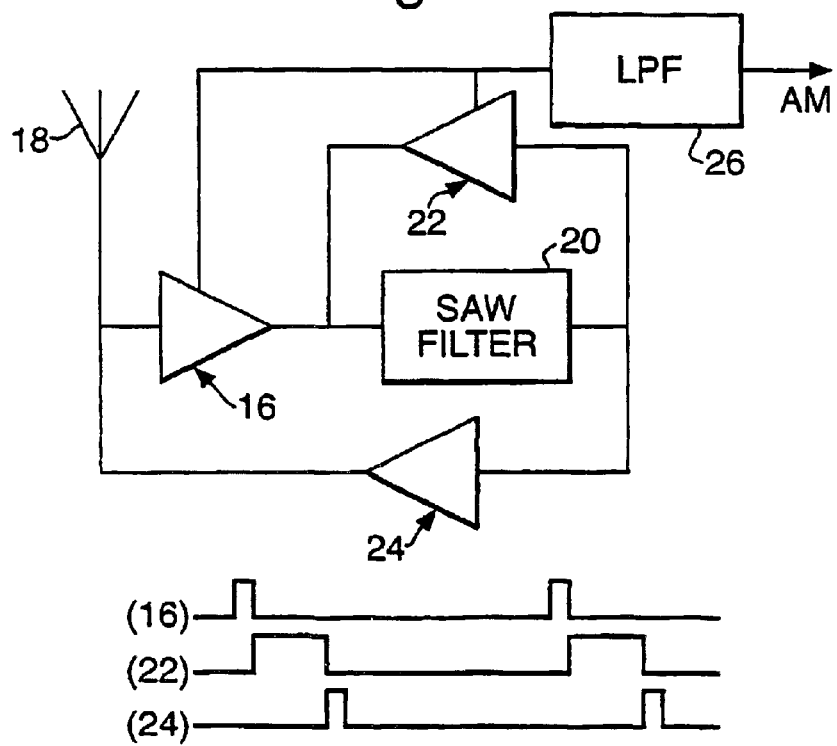

FIG. 4—shows a block diagram of a transceiver in accordance with the invention

In the receiver embodiment shown in FIG. 1, an input amplifier 2 samples the signal from the antenna 4, amplifies and applies it to the input to a SAW delay 6 (implemented as the group delay of a filter). When the signal begins to emerge from the SAW delay 6 the input amplifier 2 is switched off and the second amplifier 8 switched on. The signal is amplified and re-applied to the SAW input 6. When the signal emerges for a second time it is again amplified by the second amplifier 8. When the signal emerges for a third time, the second amplifier 8 is switched off. Because only one SAW device 6 is used in the embodiment shown, there is no possibility of frequency misalignment between 'stag s'. Once the signal has completed the amplification process the output signal may typically be routed via a low pass filter 10.

Thus the input amplifier 2 performs a receive sampling action on the antenna input 4. This sampling action of the amplifier 2 causes a small loss of potential amplification. For example the duty ratio of the amplifiers 2, 8 will be about 10% and this results in a 10 dB loss in ultimate gain, of the circuit. However it is offset by the action of the second amplifier 8 which is used to provide about three lots of gain to the signal. Thus the gain of the circuit approximates to the sum of the input amplifier 2 plus three times the gain of the second amplifier 8 minus the 3 times the attenuation of the SAW device 6 and minus the sampling loss. (In a research prototype this evaluated to approximately 25+3*25−3*5−10=75 dB).

The detection action is performed by monitoring the collector currents of the amplifiers 2, 8, this current being proportional to the input power to the receiver and performs an AM detection of the command tones.

The receiver is devised to use the minimum of electrical components, which aids the reduction of current consumption and physical size and provides for improvements in reliability. The use of this innovative design provides for circuit elements to be arranged to perform multiple functions.

A single SAW filter 6 is used to provide a means of determining the receiver's centre frequency and the filter's group delay characteristics are used to provide an electrical delay as part of sequential amplifier.

Two amplifier sections are employed 2, 8, the gating of the amplifier control acts as an RF switch which isolates the stage from its input and output. The second stage amplifier 8 re-amplifies the signal several times resulting in high net gain. (This re-circulation is counter to intuition as normally this would result in instability.)

The definition of the SAW filter 6 characteristics of the group delay and the amplitude response control the operation of the re-circulating amplifier. These characteristics may be satisfied by a $4^{th}$ order filter design.

AM detection is performed by a similar technique to that used by successive logarithmic amplifiers, where the supply current rises as a proportion of the input signal level.

Certain specific difficulties overcome during development of the invention include, Dwell Time Sufficient time must be allowed for the signal to die away. The surface acoustic wave is reflected at each end of the filter, and although there is loss both on transit and reflection, energy is still present after several transits of the filter. If this energy is above noise level when the input amplifier is turned on, the receiver will be desensitised. In practice, when the input amplifier is turned on for 4 microseconds, the re-circulating amplifier is on for 16 microseconds, a further 44 microseconds must be allowed before the input amplifier may be re-engaged. While this has a benefit of saving supply current it also desensitises the receiver.

Input Sampling

Input amplifier sampling is a critical aspect of receiver performance. The input amplifier must be on for at least as long as the transit delay of the filter, and a certain amount longer than this so that gating of the input signal occurs after the filter and not before. Any switching of the signal constitutes mixing, and will broaden the pass-band considerably. If the switching occurs before the filter, the filter shape will be compromised. However, if the amplifier was switched on before the input is required, no switching edge is seen by the system at the expense of greater energy consumption.

At the trailing edge of the input pulse more precision is required. There must be no overlap of the switching waveforms otherwise both amplifiers will be on together, and instability is likely. Conversely if the gap is too large, signal, and consequentially sensitivity, is lost as energy dies away in the SAW filter before it can be amplified by the second stage.

Noise Amplification

There is no point in leaving the re-circulating amplifier energised for a longer period in an attempt to increase the sensitivity. With very small signals the input stage produces noise and once the re-circulating amplifier has reached limiting on this input noise there is no more information about the signal to be gained. In fact leaving the re-circulating amplifier on too long merely increases current consumption and risks instability.

Max AM Frequency

With a switching rate of 16 kHz (derived from the 64 $\mu$s cycle time) it is theoretically impossible to receive amplitude modulation at a frequency above 8 kHz, however in our prototype the highest frequency is less than 1 kHz so bandwidth is not a problem. The 16 kHz switching rate does need to be filtered out, however, and a ratio of 16 to 1 means that a 3 pole filter network is necessary. This is provided by the active filter surrounding the first operational amplifier.

Off-Frequency Stability

The second amplifier has its output connected to its input via the SAW filter. There is a threat that at frequencies where the group d lay is small, a signal could pass quickly from the output back to the input Because the amplifier is switch d on for a finite time the off-centre frequency signals could have many more than 4 sets of amplification. It is important at these frequencies that the attenuation of the filter is greater than the amplifier gain in order to maintain stability.

With reference to FIG. 2, in the left hand example 12 the attenuation is less than the amplifier gain at the point where there is only a short delay, which means that it may be unstable. In the right hand example 14 the attenuation is larger than the gain and the circuit is stable.

Specific Characteristics of the Delay Include;

Rise Time Control

The rate at which the RF amplifiers are switched on and off is important. In particular switching the amplifiers on too quickly seems to introduce a noise impulse into the SAW filter. By controlling the rise time to be more than 0.5 $\mu$s the noise injection is minimised and sensitivity is not degraded.

In practice control lines are likely to be slew rate limited due to the impedance of the low current ASIC output stages.

Successive detection of the signal takes place in the amplifying transistors without the need of a separate detector stage (the technique that is used in logarithmic amplifiers). FIG. 3 shows the supply current consumed by the receiver plotted against time (each graduation being 4 $\mu$s) for various input signal amplitudes.

An AM signal comprises a sequence of 100% amplitude modulated tones. For example if a signal level of −90 dBm were being received during the 100% phase of the modulation then no signal would be present during the 0% phase. The energy consumed by the receiver, denoted by the area under each curve (current×time), is different for the two signal levels and this appears as an alternating voltage at the tone (data) rate The collector current of the two amplifier transistors is summed, low pass filtered to remove the switching component, and amplified until limiting occurs. This output is then ready for digital processing by the digital ASIC.

Note: this form of AM detection applies to 100% modulated data or tone sequences and not to analogue AM signals (i.e. those that do not have modulation levels in the region of 50%).

In a further embodiment of the invention, a transceiver is provided. The characteristics of a transceiver produced in accordance with the invention include the provision of a very small low current device with no local oscillator or active RF source and an inherent ranging capability.

In FIG. 4 an input amplifier 14 samples the signal from an antenna 18, amplifies and applies it to the input to a SAW delay 20. When the signal begins to emerge from the SAW delay 20 the input amplifier 16 is switched off and the second amplifier 22 is switched on. The signal is amplified and re-applied to the SAW input 20. When the signal emerges for a second time it is again amplified by the second amplifier 22. When it emerges for a third time the second amplifier 22 is switched off and the transmit amplifier 24 is switched on. The device now switches off for a short period while the energy in the SAW delay 20 dies away before repeating the cycle.

Once the recieved signal has completed the amplification process, an output of the signal may typically be routed via a low pass filter 26.

Thus the input amplifier 16 performs a receive sampling action on the signal at the antenna input 18. The second amplifier 22 is used to provide substantial gain and the transmit amplifier 24 provides RF energy back to the antenna 18. Because the return signal is an amplified version of that received, the frequency is identical and the station listening to the return signal can use very narrow filters and achieve great sensitivity.

There is an implicit (AM) receiver function within the circuitry where detection is performed by monitoring the collector currents of the amplifiers, this current is proportional to the input signal level to the device.

Ranging can be gauged by measuring the round trip delay from an illuminating station through the device and return. The timings through the device are crystal accurate and comprise:

a) receiver input amplifier 16 which is gated on for fixed period (this was 4 $\mu$s in the prototype), b) delay through device is not dependant on propagation delay through the SAW 20 but controlled by the duration of amplifier 22, c) transmitter stage is gated on for fixed period (again 4 $\mu$s).

Long distance ranging can be provided by making the transmitter amplifier 24 transmit for a relatively long period (the 4 $\mu$s). Short distance ranging can be provided by making the transmitter amplifier 24 transmit for a very short period (20 ns). The lower average power of the short range system can be offset by the reduced propagation loss and hence the signal to noise ratio is maintained.

Inherent receiver is used to listen to commands addressed to a particular device. These commands could control equipment to the perform specific actions:

a) to acquire the timing of the base station illumination, b) to provide a return transmission containing data, c) to provide long distance ranging transmissions (using wide pulses), d) to provide short distance relative ranging transmissions (using a high frequency code).

Data transmission can be achieved using a low data rate OOK modulation imposed on the return transmission.

The device will be robust and reliable. The components susceptible to mechanical shock are the clock crystal and the SAW delay, both of which exhibit much higher shock resistance than RF crystals. The device has a very low parts count and has high integration of digital functions within the ASIC and this is likely to be very reliable.

Low probability of intercept is achieved by having no RF sources within the device (there is no LO in the receiver or active source for the transmitter). Thus a deployed device operating without illumination would radiate no signals and the only effect would be a small increase in the noise floor when in intimate proximity with the device. When illuminated the incoming signal is likely to dominate any emission from the device which is on exactly the same frequency and so the presence of the device is difficult to ascertain. When the device is transmitting the return signal, being on the same frequency as the illumination, is not particularly noticeable as a new signal and can only be gauged by an apparent increase in the illumination in the vicinity of the device.

Further the illumination could be hopped over a small frequency band in a pseudo-random fashion and so the signals would be dispersed and less detectable with a narrow band scanner.

What is claimed is:

1. A re-circulating amplifier comprising:

a SAW filter with group delay characteristics, said characteristics providing a time delay function; and a sampling amplifier for sampling an input signal, wherein said input signal passes three times through said further amplifier and SAW filter to provide high net gain.

2. A re-circulating amplifier in accordance with claim 1, wherein said SAW filter comprises a combination of characteristics including group delay and frequency selectivity simultaneously as part of a sequential amplifier.

3. A re-circulating amplifier in accordance with claim 1, wherein said input signal passes a plurality of times through said further amplifier and SAW filter to provide high net gain to said input signal.

4. A re-circulating amplifier in accordance with claim 1, wherein said sampling amplifier is switched in accordance with said delay characteristics of said SAW filter.

5. A re-circulating amplifier comprising:

a SAW filter with group delay characteristics, said characteristics providing a time delay function;

a sampling amplifier for sampling an input signal; and a further amplifier associated with said SAW filter for re-circulating said input signal, wherein switching waveforms of said sampling amplifier and said further amplifier do not overlap.

6. A receiver comprising a re-circulating amplifier in accordance with claim 1, wherein said re-circulating amplifier does not comprise a local oscillator or super-regeneration means.

7. A transceiver comprising a re-circulating amplifier in accordance with claim 1, wherein said re-circulating amplifier does not comprise a local oscillator or super-regeneration means.

8. A re-circulating amplifier in accordance with claim 5, wherein said SAW filter comprises a combination of characteristics including group delay and frequency selectivity simultaneously as part of a sequential amplifier.

9. A re-circulating amplifier in accordance with claim 5, wherein said input signal passes a plurality of times through said further amplifier and SAW filter to provide high net gain to said input signal.

10. A re-circulating amplifier in accordance with claim 5, wherein said sampling amplifier is switched in accordance with said delay characteristics of said SAW filter.

11. A receiver comprising a re-circulating amplifier in accordance with claim 5, wherein said re-circulating amplifier does not comprise a local oscillator or super-regeneration means.

12. A transceiver comprising a re-circulating amplifier in accordance with claim 5, wherein said re-circulating amplifier does not comprise a local oscillator or super-regeneration means.

* * * * *